(12) United States Patent
Kawamura et al.

(10) Patent No.: US 8,829,521 B2
(45) Date of Patent: Sep. 9, 2014

(54) TFT BOARD FOR LIQUID CRYSTAL DISPLAY DEVICE AND MANUFACTURING METHOD FOR LIQUID CRYSTAL DISPLAY DEVICE

(75) Inventors: Tetsuya Kawamura, Hyogo (JP); Masumi Yoshida, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 333 days.

(21) Appl. No.: 12/969,168

(22) Filed: Dec. 15, 2010

(65) Prior Publication Data

US 2011/0233552 A1    Sep. 29, 2011

(30) Foreign Application Priority Data

Mar. 23, 2010    (JP) ................. 2010-066392

(51) Int. Cl.
*H01L 33/16*    (2010.01)
*H01L 21/66*    (2006.01)
*G02F 1/1362*    (2006.01)

(52) U.S. Cl.
CPC .... *H01L 22/14* (2013.01); *G02F 2001/136222* (2013.01); *G02F 1/136209* (2013.01)
USPC .............. 257/59; 257/E21.521; 257/E33.053; 349/139; 349/143; 349/193; 438/16

(58) Field of Classification Search
USPC ............. 257/59, E21.521, E33.053; 349/139, 349/143, 193; 438/16
See application file for complete search history.

(56) References Cited

U.S. PATENT DOCUMENTS

| | | | |
|---|---|---|---|
| 5,818,550 A | | 10/1998 | Kadota et al. |
| 5,943,107 A | * | 8/1999 | Kadota et al. ................. 349/44 |
| 6,778,232 B2 | * | 8/2004 | Nakata et al. ................. 349/43 |
| 2002/0101557 A1 | | 8/2002 | Ono et al. |
| 2002/0140891 A1 | * | 10/2002 | Tomioka et al. ............. 349/141 |
| 2008/0042135 A1 | * | 2/2008 | Ryu et al. ..................... 257/59 |
| 2009/0303423 A1 | * | 12/2009 | Kim et al. ..................... 349/110 |

FOREIGN PATENT DOCUMENTS

| | | |
|---|---|---|
| JP | 08-122824 | 5/1996 |
| JP | 2001-021878 | 1/2001 |
| JP | 2002-258262 | 9/2002 |

* cited by examiner

*Primary Examiner* — Matthew W Such
*Assistant Examiner* — David Spalla
(74) *Attorney, Agent, or Firm* — Hamre, Schumann, Mueller & Larson, P.C.

(57) ABSTRACT

Provided is a TFT board for a liquid crystal display device including: a circuit layer formed on a substrate, the circuit layer including a thin film transistor including a semiconductor layer, a gate electrode, a drain electrode, and a source electrode; and a color filter layer formed on the circuit layer. The color filter layer has a through hole formed therein above the semiconductor layer in a region between the source electrode and the drain electrode.

10 Claims, 7 Drawing Sheets

TFT BOARD FOR LIQUID CRYSTAL DISPLAY DEVICE AND MANUFACTURING METHOD FOR LIQUID CRYSTAL DISPLAY DEVICE

CROSS-REFERENCE TO RELATED APPLICATION

The present application claims priority from Japanese application JP 2010-066392 filed on Mar. 23, 2010, the content of which is hereby incorporated by reference into this application.

BACKGROUND OF THE INVENTION

1. Field of the Invention

The present invention relates to a thin film transistor (TFT) board for a liquid crystal display device and a manufacturing method for a liquid crystal display device.

2. Description of the Related Art

A thin film transistor formed on a TFT board of a liquid crystal display device may be efficiently tested with an assist of light. More specifically, after electric charges are charged in a pixel electrode to turn OFF a thin film transistor, the thin film transistor is irradiated with light for testing. When the light enters a semiconductor layer of the thin film transistor, carriers are generated to increase conductivity. Note that, the light used here has an intensity level that does not cause the thin film transistor to turn ON if the thin film transistor is normal. Therefore, if the thin film transistor to be tested is normal, the thin film transistor remains OFF even when light is applied thereto. However, if turning ON of the thin film transistor is detected, it is found that the thin film transistor has defects.

Conventionally, there is known a structure in which a color filter or a black matrix is formed above the thin film transistor of the TFT board (see Japanese Patent No. 4152623).

When the color filter or the black matrix is formed above the thin film transistor, it is impossible to irradiate the thin film transistor with light. Therefore, the above-mentioned testing method is inapplicable.

SUMMARY OF THE INVENTION

It is an object of the present invention to provide a TFT board for a liquid crystal display device and a manufacturing method for a liquid crystal display device, which are capable of performing testing of a thin film transistor by using light.

(1) According to the present invention, a TFT board for a liquid crystal display device includes: a substrate; a circuit layer formed on the substrate, the circuit layer including a thin film transistor including a semiconductor layer, a gate electrode, a drain electrode, and a source electrode; and a color filter layer formed on the circuit layer, in which the color filter layer has a through hole formed therein above the semiconductor layer in a region between the source electrode and the drain electrode. According to the present invention, through the through hole, the thin film transistor may be tested by using light.

(2) The TFT board for a liquid crystal display device described in Item (1) may further include a light transmissive layer formed in the through hole.

(3) In the TFT board for a liquid crystal display device described in Item (2), the light transmissive layer may have different light transmittances depending on wavelengths, and may transmit light used for testing the thin film transistor.

(4) In the TFT board for a liquid crystal display device described in Item (1), the color filter layer may include colored layers of a plurality of colors. Further, among the colored layers of the plurality of colors, at least one colored layer may be formed to have the through hole formed therein, while another colored layer different in color from the at least one colored layer may be formed without the through hole. Still further, the through hole may have a layer formed therein, the layer being formed of the same material as a material of the another colored layer without the through hole.

(5) In the TFT board for a liquid crystal display device described in Item (2), the color filter layer may have a pixel electrode formed thereon, the pixel electrode being connected to the thin film transistor, and the pixel electrode may be formed so as to overlap the light transmissive layer.

(6) According to the present invention, a manufacturing method for a liquid crystal display device includes: preparing a TFT board in which a circuit layer is formed, the circuit layer including a thin film transistor including a semiconductor layer, a gate electrode, a drain electrode, and a source electrode; testing the thin film transistor by applying light to the semiconductor layer from a region between the source electrode and the drain electrode; forming, after the testing is completed, a black matrix above the semiconductor layer in the region between the source electrode and the drain electrode; and facing the TFT board to a counter substrate and providing liquid crystal between the TFT board and the counter substrate. According to the present invention, the testing is performed before the black matrix is formed, and hence the thin film transistor may be tested by using light, without being interrupted by the black matrix.

(7) In the manufacturing method for a liquid crystal display device described in Item (6), the TFT board may be prepared so as to include a color filter layer formed on the circuit layer, the color filter layer may have a through hole formed therein above the semiconductor layer in the region between the source electrode and the drain electrode, the testing may be performed by applying the light through the through hole, and the black matrix may be formed in the through hole.

(8) In the manufacturing method for a liquid crystal display device described in Item (6), the TFT board may be prepared so as to include a color filter layer formed on the circuit layer, the color filter layer may have a through hole formed therein above the semiconductor layer in the region between the source electrode and the drain electrode, the manufacturing method may further include forming a light transmissive layer in the through hole, the light transmissive layer transmitting the light, the testing may be performed by applying the light through the light transmissive layer, and the black matrix may be formed on the light transmissive layer.

(9) In the manufacturing method for a liquid crystal display device described in any one of Items (6) to (8), the black matrix may be formed so as to be laid above the source electrode and the drain electrode.

DETAILED DESCRIPTION OF THE INVENTION

Hereinafter, embodiments of the present invention are described with reference to the drawings.

[First Embodiment]

Figure 1:
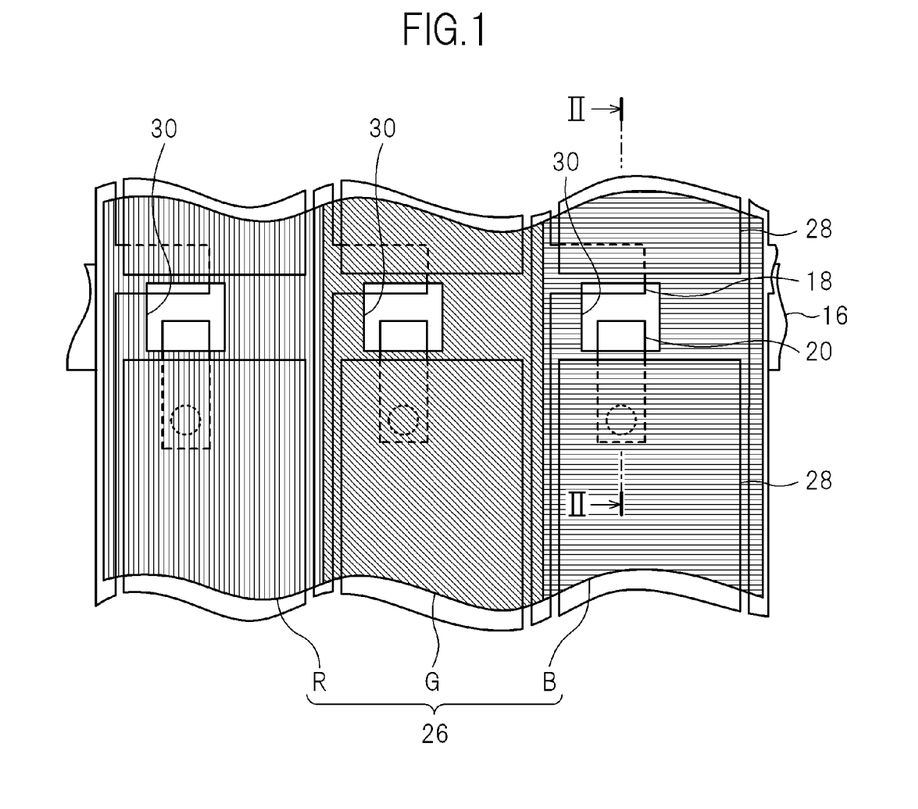
FIG. 1 is a plan view illustrating a part of a TFT board for a liquid crystal display device according to a first embodiment of the present invention.
Figure 2:
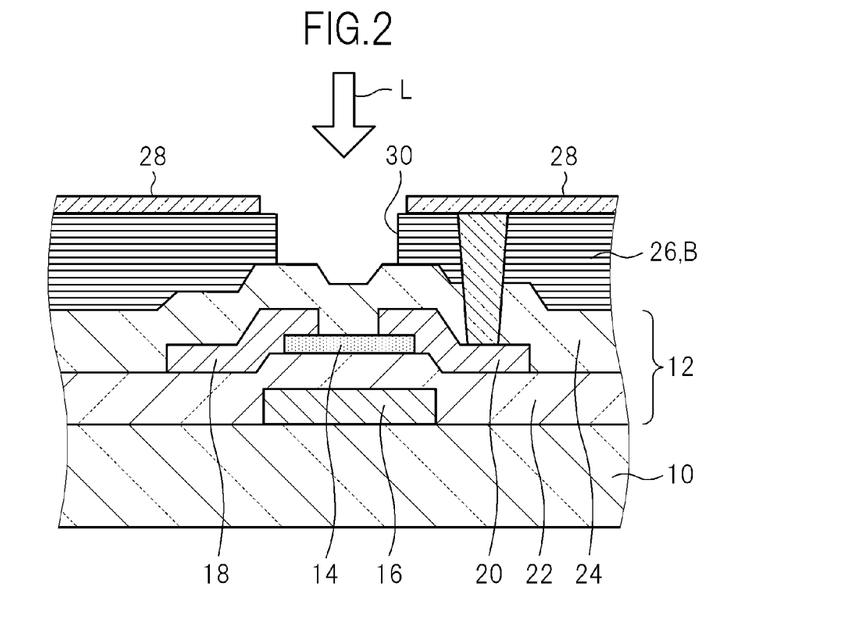
FIG. 2 is a cross-sectional view illustrating the TFT board for a liquid crystal display device taken along the line II-II of FIG. 1.

FIG. 1 is a plan view illustrating a part of a TFT board for a liquid crystal display device according to a first embodiment of the present invention. FIG. 2 is a cross-sectional view illustrating the TFT board for a liquid crystal display device taken along the line II-II of FIG. 1.

The TFT board for a liquid crystal display device includes a substrate 10. The substrate 10 is formed of a light transmissive material (for example, glass). A circuit layer 12 is formed on the substrate 10. The circuit layer 12 includes a thin film transistor. The thin film transistor includes a semiconductor layer 14, a gate electrode 16, a drain electrode 18, and a source electrode 20.

In the example illustrated in FIG. 2, the gate electrode 16 is formed on the substrate 10. A gate insulating film 22 is formed on the substrate 10 so as to cover the gate electrode 16. The gate insulating film 22 is formed of a light transmissive material (for example, silicon nitride (SiN)). The semiconductor layer 14 (for example, amorphous silicon layer) is formed on the gate insulating film 22 above the gate electrode 16. The source electrode 20 and the drain electrode 18 are formed on the gate insulating film 22 so that a part of the source electrode 20 and a part of the drain electrode 18 are laid on the semiconductor layer 14. A passivation film 24 (for example, film formed of an inorganic material) is formed on the gate insulating film 22 so as to cover the source electrode 20 and the drain electrode 18. The passivation film 24 is formed of a light transmissive material (for example, silicon dioxide ($SiO_2$)).

A color filter layer 26 is formed on the circuit layer 12. The color filter layer 26 includes colored layers R, G, and B of different colors (for example, red, green, and blue). Each of the colored layers R, G, and B of different colors has different light transmittances depending on wavelengths. A pixel electrode 28 is formed on the color filter layer 26 so as to be electrically connected to one of the source electrode 20 and the drain electrode 18 through a through hole passing through the color filter layer 26 and the passivation film 24. The pixel electrode 28 is formed on the color filter layer 26, and hence the pixel electrode 28 may be spaced away from the electrodes of the thin film transistor.

The color filter layer 26 (specifically, each of the colored layers R, G, and B) has a through hole 30 formed therein above the semiconductor layer 14 (that is, above a channel) in a region between the source electrode 20 and the drain electrode 18. Therefore, it is possible to test the thin film transistor by using light L for testing through the through hole 30.

More specifically, after electric charges are charged in the pixel electrode 28 and the thin film transistor is turned OFF, the thin film transistor is irradiated with the light L. When the light L enters the semiconductor layer 14 of the thin film transistor through the through hole 30, carriers are generated to increase conductivity. Note that, the light L has an intensity level that does not cause the thin film transistor to turn ON if the thin film transistor is normal. Therefore, if the thin film transistor to be tested is normal, the thin film transistor remains OFF even when the light L is applied thereto. However, if turning ON of the thin film transistor is detected, it is found that the thin film transistor has defects.

[Second Embodiment]

Figure 3:
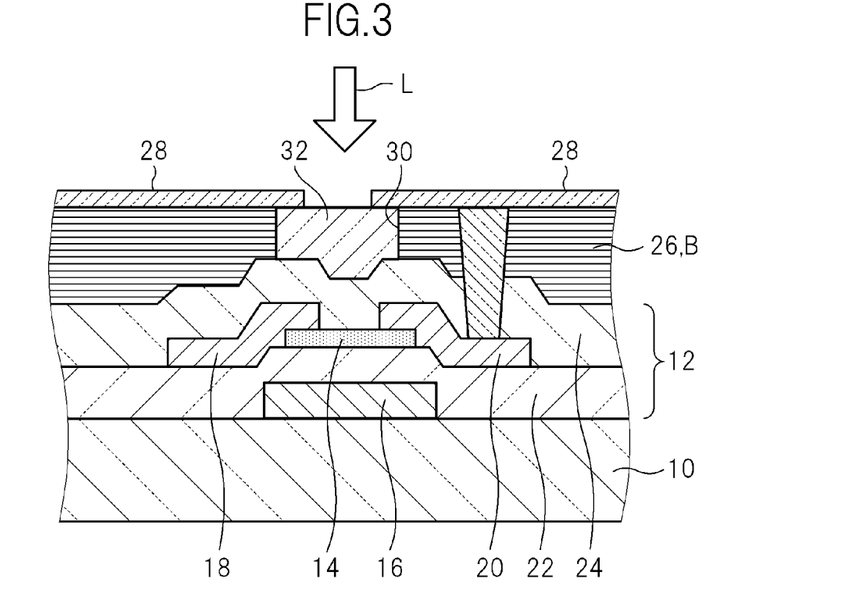
FIG. 3 is a cross-sectional view illustrating a part of a TFT board for a liquid crystal display device according to a second embodiment of the present invention.

FIG. 3 is a cross-sectional view illustrating a part of a TFT board for a liquid crystal display device according to a second embodiment of the present invention. In this embodiment, in the through hole 30, a light transmissive layer 32 is formed. The light transmissive layer 32 may be transparent, or may have a color which is not used in the color filter layer 26. Other configurations and functional effects correspond to those described in the first embodiment.

By providing the light transmissive layer 32, it is possible to improve the flatness of the color filter layer 26. By improving the flatness, the following effects may be expected. That is, light leakage may be suppressed, which occurs at a stepped portion due to a disorder of liquid crystal molecule alignment. Further, the pixel electrode 28 may be overlapped on the light transmissive layer 32. In this manner, the pixel electrode 28 is capable of being increased in size, and a controllable area of the liquid crystal molecules may be increased. Therefore, an aperture ratio may be improved without increasing a parasitic capacitance of the transistor.

[Third Embodiment]

Figure 4:
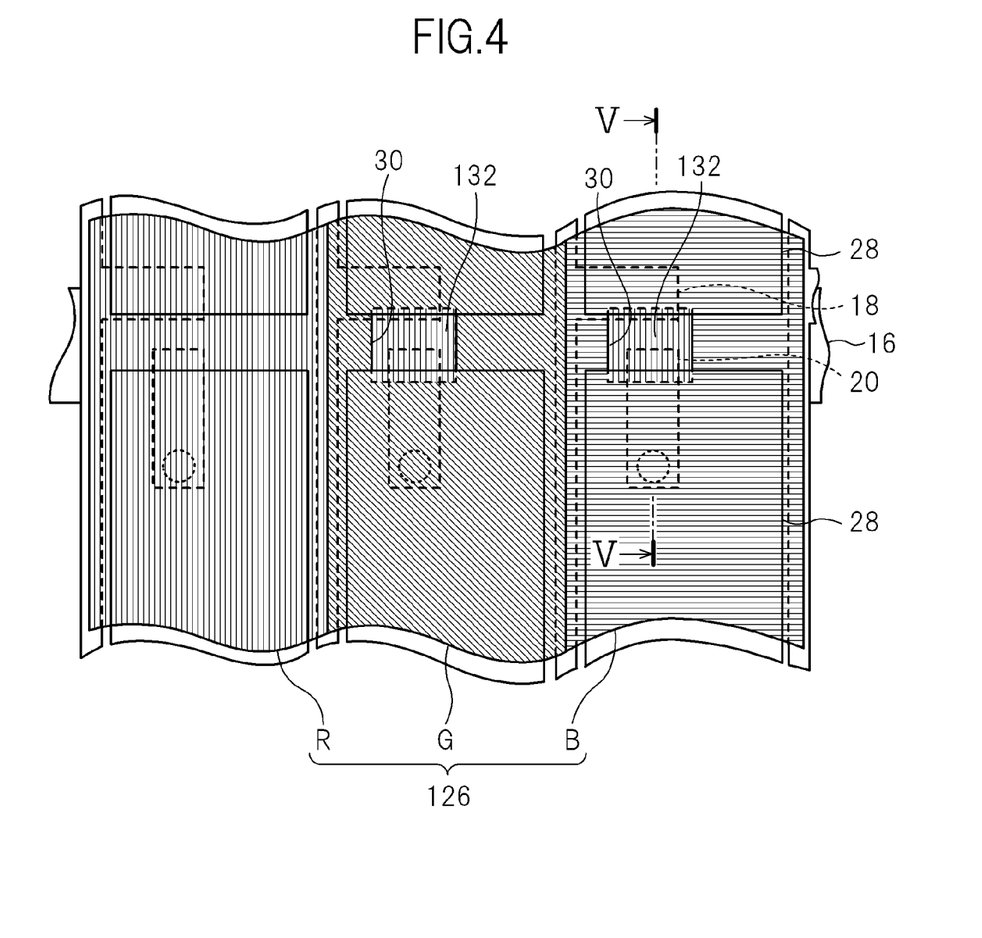
FIG. 4 is a plan view illustrating a part of a TFT board for a liquid crystal display device according to a third embodiment of the present invention.
Figure 5:
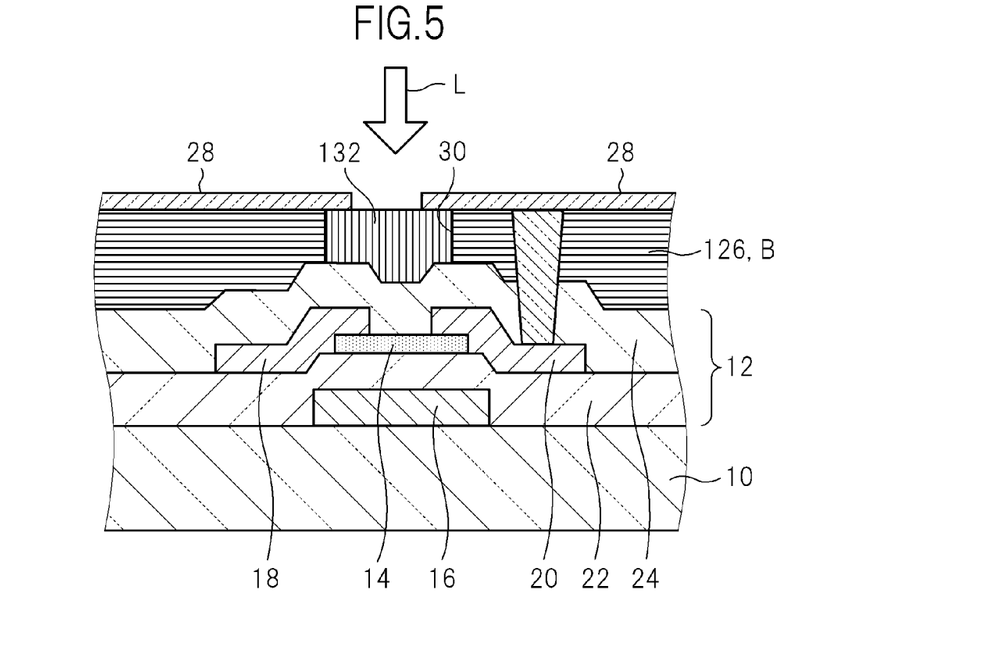
FIG. 5 is a cross-sectional view illustrating the TFT board for a liquid crystal display device taken along the line V-V of FIG. 4.

FIG. 4 is a plan view illustrating a part of a TFT board for a liquid crystal display device according to a third embodiment of the present invention. FIG. 5 is a cross-sectional view illustrating the TFT board for a liquid crystal display device taken along the line V-V of FIG. 4.

Each of the colored layers R, G, and B of different colors transmits light, but has different transmittances depending on wavelengths of light. In this embodiment, the colored layer G for green and the colored layer B for blue do not transmit the light L with a wavelength used in the testing of the thin film transistor, but the colored layer R for red transmits the light L used in the testing of the thin film transistor. That is, in this embodiment, a description is given of an example in which the light L having the same color as the colored layer R is used.

Among the colored layers R, G, and B of different colors of a color filter layer 126, at least one colored layer (for example, colored layer G for green and colored layer B for blue) has the through hole 30 formed therein, while another colored layer (for example, colored layer R for red) which is different in color from the at least one colored layer does not have the through hole 30.

A light transmissive layer 132 is formed in the through hole 30. The light transmissive layer 132 has different transmittances depending on wavelengths. The light transmissive layer 132 is formed of the same material as that of the colored layer R for red, which does not have the through hole 30, and hence the light transmissive layer 132 transmits the light L used for testing the thin film transistor. Therefore, it is possible to test the thin film transistor by using the light L.

Further, the pixel electrode 28 may be overlapped on the light transmissive layer 132, and hence this embodiment may provide the same effects as those provided in the second embodiment.

[Fourth Embodiment]

Figure 6:
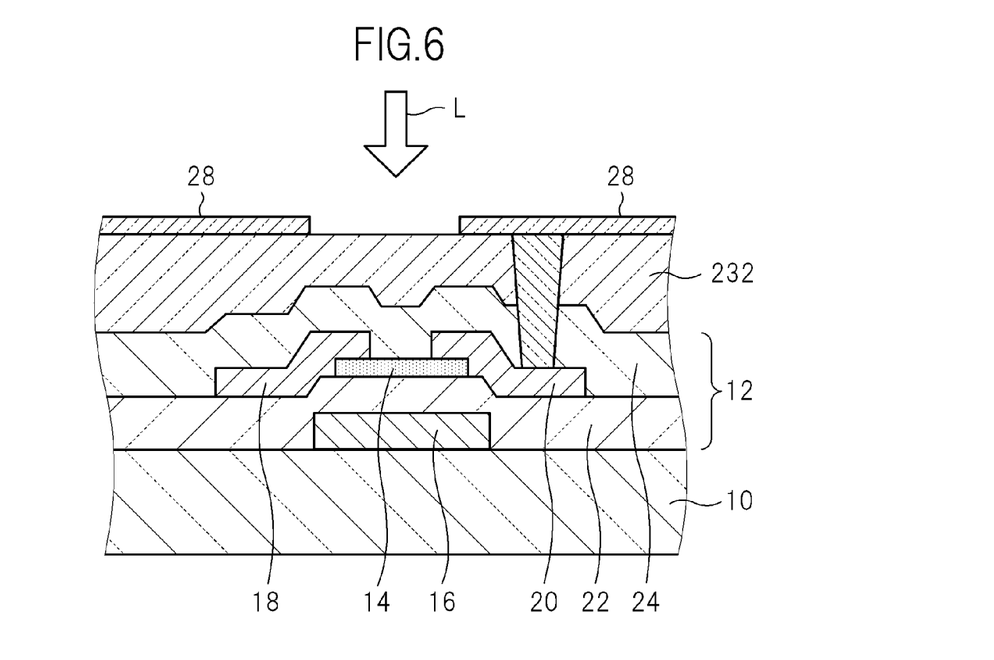
FIG. 6 is a view illustrating a manufacturing method for a liquid crystal display device according to a fourth embodiment of the present invention.
Figure 7:
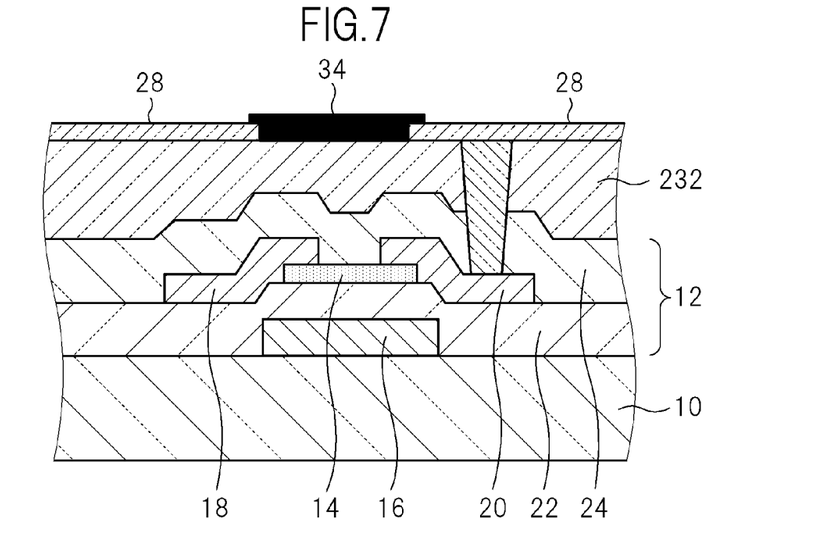
FIG. 7 is a view illustrating the manufacturing method for a liquid crystal display device according to the fourth embodiment of the present invention.
Figure 8:
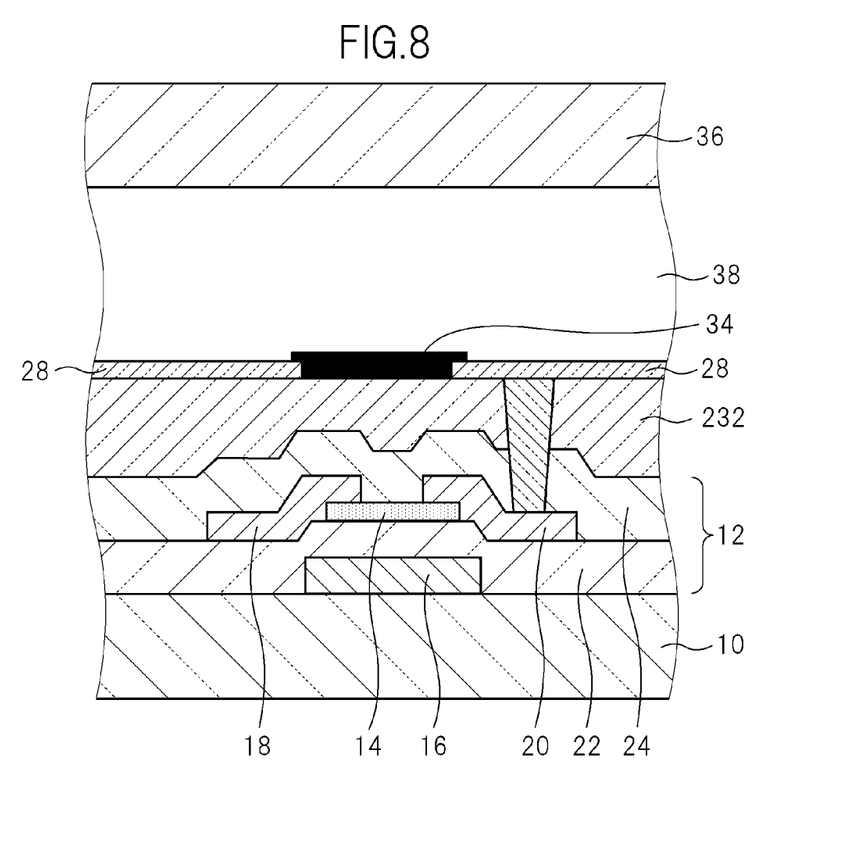
FIG. 8 is a view illustrating the manufacturing method for a liquid crystal display device according to the fourth embodiment of the present invention.

FIGS. 6 to 8 are views illustrating a manufacturing method for a liquid crystal display device according to a fourth embodiment of the present invention.

As illustrated in FIG. 6, in this embodiment, there is prepared a TFT board in which the circuit layer 12 is formed, the circuit layer 12 including a thin film transistor including the semiconductor layer 14, the gate electrode 16, the drain electrode 18, and the source electrode 20. Details thereof are the same as those described in the first embodiment. However, in this TFT board, instead of the color filter layer 26 illustrated in FIG. 2, a light transmissive layer 232 is formed. The light transmissive layer 232 may be transparent, or may have a color which is not used in the color filter layer 26. The light transmissive layer 232 transmits the light L used in the testing of the thin film transistor.

The semiconductor layer 14 is irradiated with the light L from a region between the source electrode 20 and the drain electrode 18, to thereby test the thin film transistor. Details thereof are the same as those described in the first embodiment.

As illustrated in FIG. 7, after the testing is completed, a black matrix 34 is formed above the semiconductor layer 14 in the region between the source electrode 20 and the drain electrode 18. The black matrix 34 is formed so as to be laid above the source electrode 20 and the drain electrode 18.

As illustrated in FIG. 8, the TFT board is caused to face a counter substrate 36, and liquid crystal 38 is provided between the TFT board and the counter substrate 36.

According to this embodiment, the transistor is tested before the black matrix 34 is formed, and hence the thin film transistor may be tested by using the light L without being interrupted by the black matrix 34.

[Fifth Embodiment]

Figure 9:
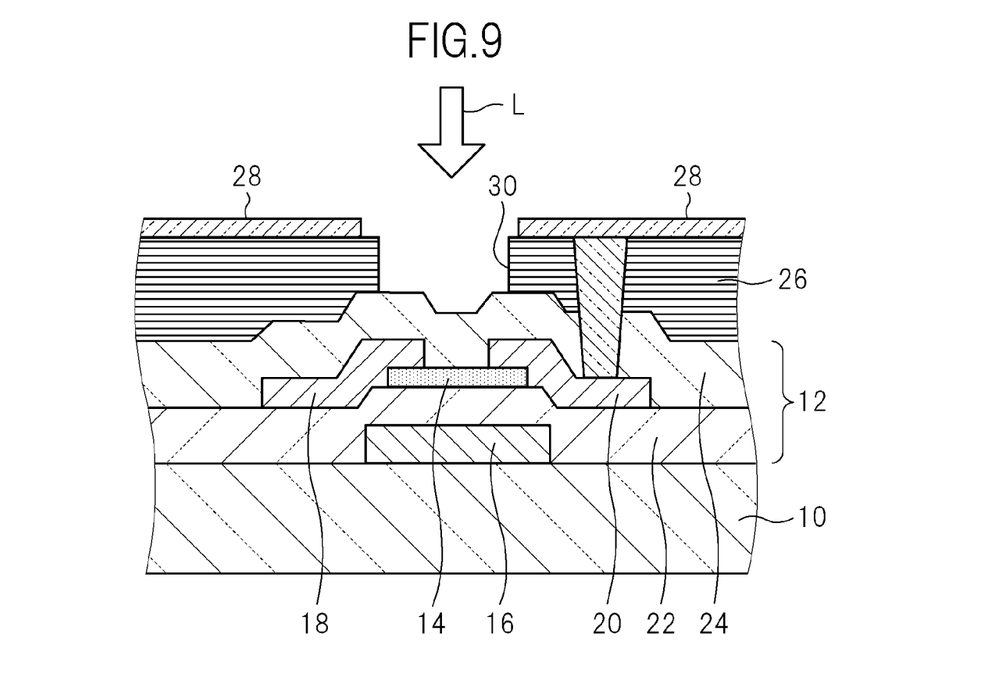
FIG. 9 is a view illustrating a manufacturing method for a liquid crystal display device according to a fifth embodiment of the present invention.
Figure 10:
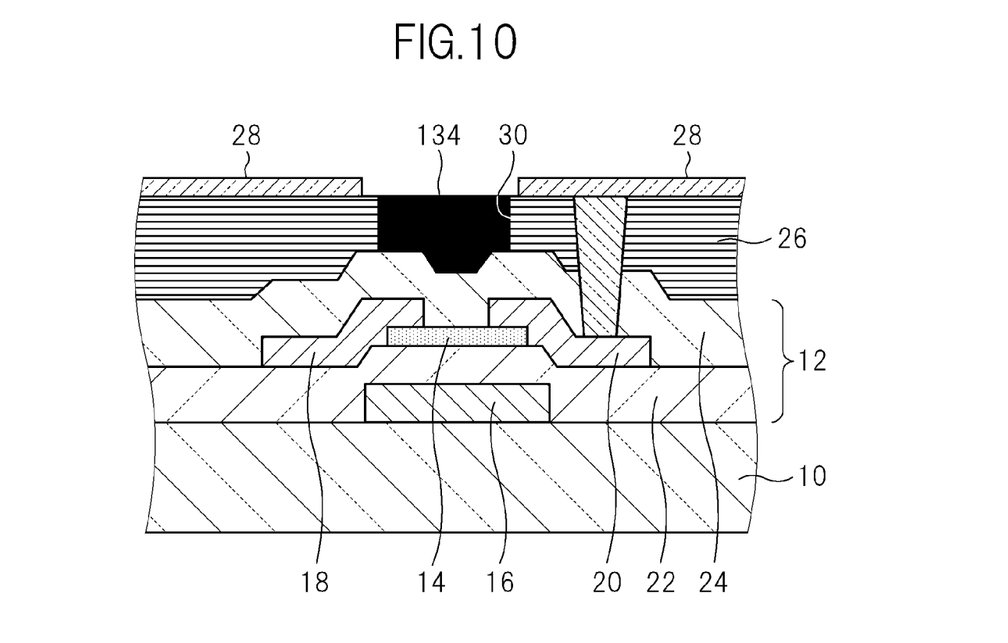
FIG. 10 is a view illustrating the manufacturing method for a liquid crystal display device according to the fifth embodiment of the present invention.

FIGS. 9 and 10 are views illustrating a manufacturing method for a liquid crystal display device according to a fifth embodiment of the present invention.

In this embodiment, the TFT board including the color filter layer 26 formed on the circuit layer 12 is prepared. The color filter layer 26 has the through hole 30 formed therein above the semiconductor layer 14 in the region between the source electrode 20 and the drain electrode 18. Details thereof are the same as those described in the first embodiment.

As illustrated in FIG. 9, the testing is performed by irradiating the semiconductor layer 14 with the light L through the through hole 30. Details thereof are the same as those described in the first embodiment.

As illustrated in FIG. 10, a black matrix 134 is formed in the through hole 30. More specifically, a light shielding material is formed in the through hole 30.

According to this embodiment, the transistor is tested before the black matrix 134 is formed, and hence the thin film transistor may be tested by using the light L without being interrupted by the black matrix 134.

[Sixth Embodiment]

Figure 11:
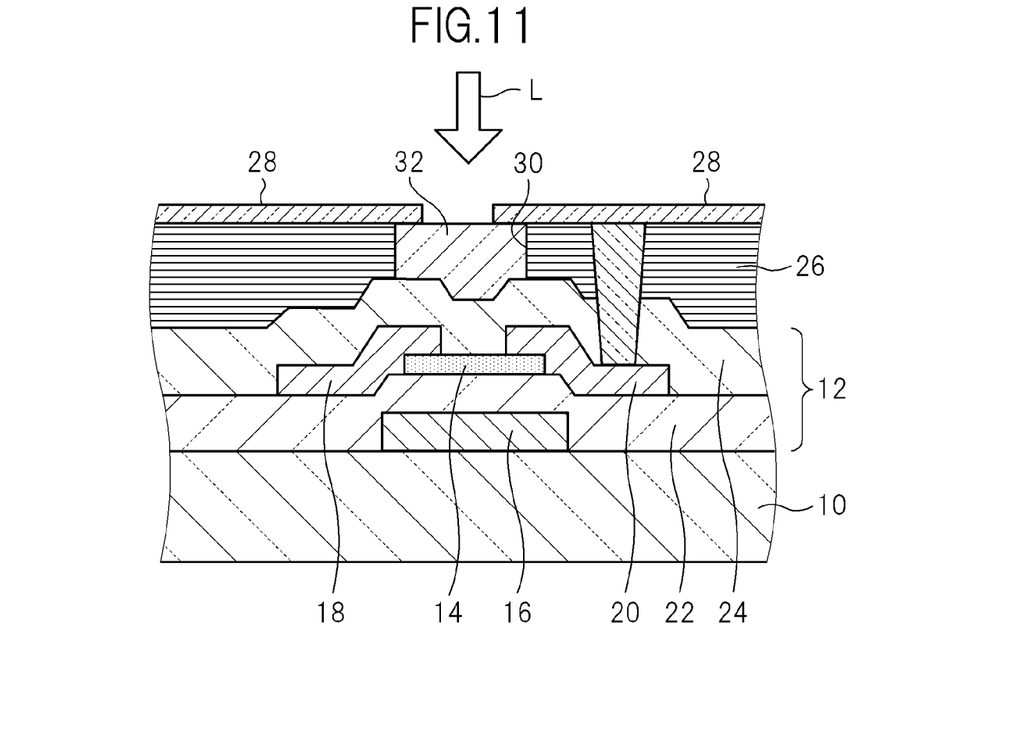
FIG. 11 is a view illustrating a manufacturing method for a liquid crystal display device according to a sixth embodiment of the present invention.
Figure 12:
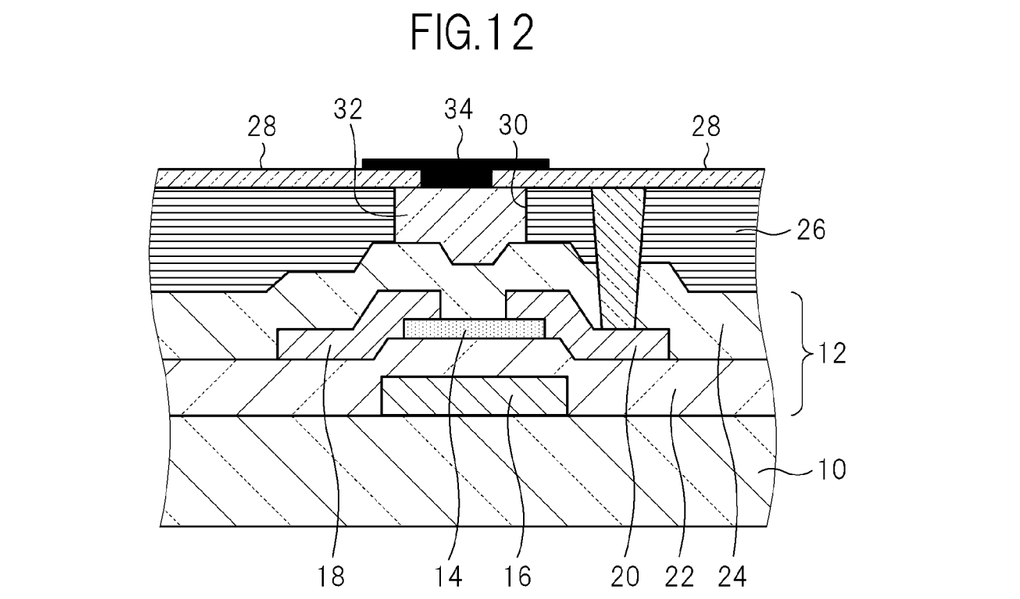
FIG. 12 is a view illustrating the manufacturing method for a liquid crystal display device according to the sixth embodiment of the present invention.

FIGS. 11 and 12 are views illustrating a manufacturing method for a liquid crystal display device according to a sixth embodiment of the present invention.

In this embodiment, the TFT board including the color filter layer 26 formed on the circuit layer 12 is prepared. The color filter layer 26 has the through hole 30 formed therein above the semiconductor layer 14 in the region between the source electrode 20 and the drain electrode 18. Details thereof are the same as those described in the first embodiment. Then, in the through hole 30, for example, the transparent light transmissive layer 32 is formed. The light transmissive layer 32 transmits the light L used in the testing of the thin film transistor. The light transmissive layer 32 may be formed of the same material as that of a spacer (not shown) for maintaining a gap between the substrate 10 and the counter substrate 36, and also may be formed simultaneously therewith.

As illustrated in FIG. 11, the testing is performed by irradiating the semiconductor layer 14 with the light L through the light transmissive layer 32. Details thereof are the same as those described in the first embodiment.

As illustrated in FIG. 12, the black matrix 34 is formed on the light transmissive layer 32. More specifically, the black matrix 34 is formed above the semiconductor layer 14 in the region between the source electrode 20 and the drain electrode 18. Further, the black matrix 34 is formed so as to be laid above the source electrode 20 and the drain electrode 18.

According to this embodiment, the transistor is tested before the black matrix 34 is formed, and hence the thin film transistor may be tested by using the light L without being interrupted by the black matrix 34.

Further, the pixel electrode 28 may be overlapped on the light transmissive layer 32, and hence this embodiment may provide the same effects as those provided in the second embodiment.

The present invention is not limited to the embodiments described above, and various modifications may be made thereto. For example, the structures described in the embodiments may be replaced by a structure having substantially the same structure, a structure providing the same action and effect, or a structure which may achieve the same object.

What is claimed is:

1. A TFT board for a liquid crystal display device, comprising:

a substrate;

a circuit layer formed on the substrate, the circuit layer including a thin film transistor including a semiconductor layer, a gate electrode, a drain electrode, and a source electrode; and a color filter layer formed on the circuit layer, wherein the color filter layer has a through hole formed therein above the semiconductor layer in a region between the source electrode and the drain electrode and above the gate electrode in a plane view, a width of the through hole of the color filter layer is smaller than a width of the gate electrode in a direction in which the drain electrode and the source electrode are extended, the color filter layer includes colored layers of a plurality of colors;

among the colored layers of the plurality of colors, at least one colored layer is formed to have the through hole formed therein, while another colored layer different in color from the at least one colored layer is formed without the through hole; and the through hole has a layer formed therein, the layer being formed of the same material as a material of the another colored layer without the through hole.

2. The TFT board for a liquid crystal display device according to claim 1, further comprising a light transmissive layer formed in the through hole.

3. The TFT board for a liquid crystal display device according to claim 2, wherein the light transmissive layer has different light transmittances depending on wavelengths, and transmits light used for testing the thin film transistor.

4. The TFT board for a liquid crystal display device according to claim 2, wherein:
   the color filter layer has a pixel electrode formed thereon, the pixel electrode being connected to the thin film transistor; and
   the pixel electrode is formed so as to overlap the light transmissive layer.

5. The TFT board for a liquid crystal display device according to claim 1, further comprising a passivation film formed between the color filter layer and the circuit layer.

6. The TFT board for a liquid crystal display device according to claim 1, wherein:
   a width between the drain electrode and the source electrode is smaller than the width of the through hole of the color filter.

7. The TFT board for a liquid crystal display device according to claim 1, further comprising electrodes for driving liquid crystal molecules formed above the color filter layer.

8. The TFT board for a liquid crystal display device according to claim 2, wherein the light transmissive layer is either transparent or is a non-black color that is not used in the color filter.

9. The TFT board for a liquid crystal display device according to claim 4, wherein the through hole extends through the pixel electrode.

10. A TFT board for a liquid crystal display device comprising:
   a substrate;
   a circuit layer formed on the substrate, the circuit layer including a thin film transistor including a semiconductor layer, a gate electrode, a drain electrode, and a source electrode; and
   a color filter layer formed on the circuit layer,
   wherein the color filter layer has a through hole formed therein above the semiconductor layer in a region between the source electrode and the drain electrode and above the gate electrode in a plane view,
   a width of the through hole of the color filter is smaller than a width of the gate electrode in a direction in which the drain electrode and the source electrode are extended, and
   the TFT board for a liquid crystal display device further comprises a light transmissive layer formed in the through hole, and a black matrix formed on the light transmissive layer.

* * * * *